(12) United States Patent
Culley (10) Patent No.: US 9,819,481 B2
(45) Date of Patent: Nov. 14, 2017

(54) CLOCK RECOVERY METHOD AND APPARATUS

(71) Applicant: Macnica Americas, Inc., Solana Beach, CA (US)

(72) Inventor: David Heath Culley, San Marcos, CA (US)

(73) Assignee: MACNICA AMERICAS, INC, Solana Beach, CA (US)

( * ) Notice: Subject to any disclaimer, the term of this patent is extended or adjusted under 35 U.S.C. 154(b) by 104 days.

(21) Appl. No.: 14/831,826

(22) Filed: Aug. 20, 2015

(65) Prior Publication Data

US 2017/0054548 A1    Feb. 23, 2017

(51) Int. Cl.
 *H04L 7/033*   (2006.01)
 *H04L 7/00*    (2006.01)

(52) U.S. Cl.
 CPC .......... *H04L 7/0331* (2013.01); *H04L 7/0054* (2013.01); *H04L 7/0087* (2013.01)

(58) Field of Classification Search
 CPC .... H04L 7/0331; H04L 7/0087; H04L 7/0054
 See application file for complete search history.

(56) References Cited

U.S. PATENT DOCUMENTS

| | | | | |
|---|---|---|---|---|
| 4,563,657 A * | 1/1986 | Qureshi | ................ | H03L 7/0992 331/14 |
| 5,905,767 A * | 5/1999 | Fujimura | ............. | H04B 7/0817 375/355 |
| 6,373,305 B1 * | 4/2002 | Stine | .......................... | H03L 7/08 327/141 |
| 6,738,205 B1 * | 5/2004 | Moran | ............... | G11B 5/59633 360/17 |
| 6,833,875 B1 | 12/2004 | Yang et al. | | |
| 7,042,972 B2 | 5/2006 | Fahim | | |
| 7,409,028 B2 | 8/2008 | Ham, III | | |
| 7,746,971 B2 | 6/2010 | Masui et al. | | |
| 8,804,889 B2 | 8/2014 | Palusa et al. | | |
| 9,036,764 B1 * | 5/2015 | Hossain | ................... | H03L 7/087 375/355 |
| 2004/0207763 A1 * | 10/2004 | Ciardi | ...................... | H04N 9/45 348/723 |
| 2005/0069071 A1 * | 3/2005 | Kim | ...................... | H03L 7/0814 375/355 |
| 2005/0220242 A1 * | 10/2005 | Ogasawara | ...... | G11B 20/10009 375/376 |

(Continued)

*Primary Examiner* — Kenneth Lam
(74) *Attorney, Agent, or Firm* — Plager Schack LLP (57) ABSTRACT

A method and apparatus for clock recovery is provided. The method begins when a reference pulse is extracted from a signal. This reference pulse is then compared with a clock signal. A phase of the extracted reference signal is then detected, and is done in relation to the clock signal. Phase differences between the extracted reference signal with respect to the clock signal are accumulated over a predetermined period of time. This accumulating continues until a predetermined number of phase differences has been accumulated. The accumulated phase differences are then averaged. The apparatus includes: a phase detector; a phase averaging unit in communication with a clock generator and a controller; a lock detector in communication with the phase averaging unit and a loop filter; at least one adder; at least one bypass filter; and at least one accumulator.

10 Claims, 7 Drawing Sheets

(56) References Cited

U.S. PATENT DOCUMENTS

| | | | |
|---|---|---|---|
| 2006/0215778 A1* | 9/2006 | Murthy | G06F 1/0353 375/260 |
| 2006/0256464 A1* | 11/2006 | Ozdemir | G11B 5/09 360/46 |
| 2009/0086868 A1* | 4/2009 | Shiraishi | H04L 7/0337 375/359 |
| 2011/0148490 A1* | 6/2011 | Lee | H03L 7/085 327/159 |
| 2012/0081339 A1* | 4/2012 | Mouri | H03D 13/003 345/204 |
| 2013/0088300 A1* | 4/2013 | Ichihara | H03L 7/085 331/25 |
| 2014/0177770 A1* | 6/2014 | Katumba | H03L 7/093 375/374 |
| 2014/0354262 A1* | 12/2014 | Chen | G01R 25/005 324/76.82 |
| 2016/0043860 A1* | 2/2016 | Tu | H03L 7/087 375/371 |

* cited by examiner

CLOCK RECOVERY METHOD AND APPARATUS

FIELD

The present disclosure relates generally to a clock recovery method and apparatus, and more specifically, to a method and apparatus for recovering a clock when no traditional clock reference is available, and for smoothing the jitter of a received signal even in the presence of missing reference pulses.

BACKGROUND

Some digital data streams, especially high-speed serial data streams such as the raw stream of data from the magnetic head of a disk drive or video delivered over the internet, may be sent without an accompanying clock signal. The receiver may generate a clock from an approximate frequency reference, and then phase-align to the transitions in the data stream using a phase-locked loop (PLL). This process is commonly known as clock and data recovery (CDR). It may be related to the problem of carrier recovery, which is the process of recreating a phase-locked version of the carrier when a suppressed carrier modulate scheme is used.

A particular challenge with digital data streams is recovering the transmitter clock when no data from the original clock exists. In video over Internet Protocol (IP), the data is encoded into internet packets and is sent to the receiver with an internet-rate clock. This internet-rate clock has no relation to the underlying video signal. Network congestion and other uncertainties may delay, re-route or completely lose a video packet. All of this may result in an individual packet timing having no relationship to the video transmitter clock.

One example of a situation where clock recovery is needed is the delivery of video streams over the internet. New video standards for internet delivery also present challenges to ensuring high quality video to a user. Internet delivery has become popular and is widely used. Video delivered over the internet may have skipped or duplicated video frames. Previously, a typical solution for the above problem for mismatched transmitter and receiver clocks is the use of a video frame buffer that will skip or duplicate a single frame of the video stream. Embodiments described herein provide a method and apparatus for clock recovery that eliminate the need for such a frame buffer.

There is a need for a method of clock generation that complies with jitter limitations of the standards and other equipment, and is also able to operate in the presence of imperfect data transmission (including lost or delayed packets).

SUMMARY

Embodiments contained in the disclosure provide a method of clock recovery. The method begins when a reference pulse is extracted from a signal. This reference pulse is then compared with a clock signal. A phase of the extracted reference signal is then detected, and is done in relation to the clock signal. Phase differences between the extracted reference signal with respect to the clock signal are accumulated over a predetermined period of time. This accumulating continues until a predetermined number of phase differences has been accumulated. The accumulated phase differences are then averaged.

A further embodiment provides an apparatus for clock recovery. The apparatus includes: a phase detector; a phase averaging unit in communication with a clock generator and a controller; a lock detector in communication with the phase averaging unit and a loop filter; at least one adder; at least one bypass filter; and at least one accumulator.

A still further embodiment provides an apparatus for clock recovery. The apparatus comprises: means for extracting a reference pulse from a signal; means for comparing the extracted reference pulse with a clock signal; means for detecting a phase of the extracted reference pulse in relation to the clock signal; means for accumulating a phase difference of the extracted reference pulse with respect to the clock signal over a predetermined period of time until a predetermined number of phase differences is reached; and means for averaging the phase difference.

A yet further embodiment provides a non-transitory computer readable media that includes program instructions, which when executed by a processor cause the processor to perform a method comprising the steps of: extracting a reference pulse from a signal; comparing the extracted reference pulse with a clock signal; detecting a phase of the extracted reference pulse in relation to the clock signal; accumulating a phase difference of the extracted reference pulse with respect to the clock signal over a predetermined period of time until a predetermined number of phase differences is reached; and averaging the phase difference.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

The clock recovery method and apparatus described herein provides a flexible and highly configurable block for recovering a data-rate clock from a given reference signal. The reference signal may include a regularly occurring marker within the packet stream such as an end-of-frame marker, or a regularly updated measurement of the depth of a packet buffer. The method and apparatus may be configured to generate clocks based on a variety of different PLL devices. The PLL devices include but are not limited to various commercial off-the-shelf adjustable PLL designs, a generic low frequency reference clock-based PLL solution, and a digital to analog converter (DAC) with a Voltage Controlled Oscillator (VCO). The clock controller described herein may be used in many different applications, including cable head-end timebase recovery and 1080p serial digital interface (SDI) clock generation. The apparatus may be configured to lock rapidly to a clean reference signal, or to remain stable when given a jittery reference signal.

Figure 1:
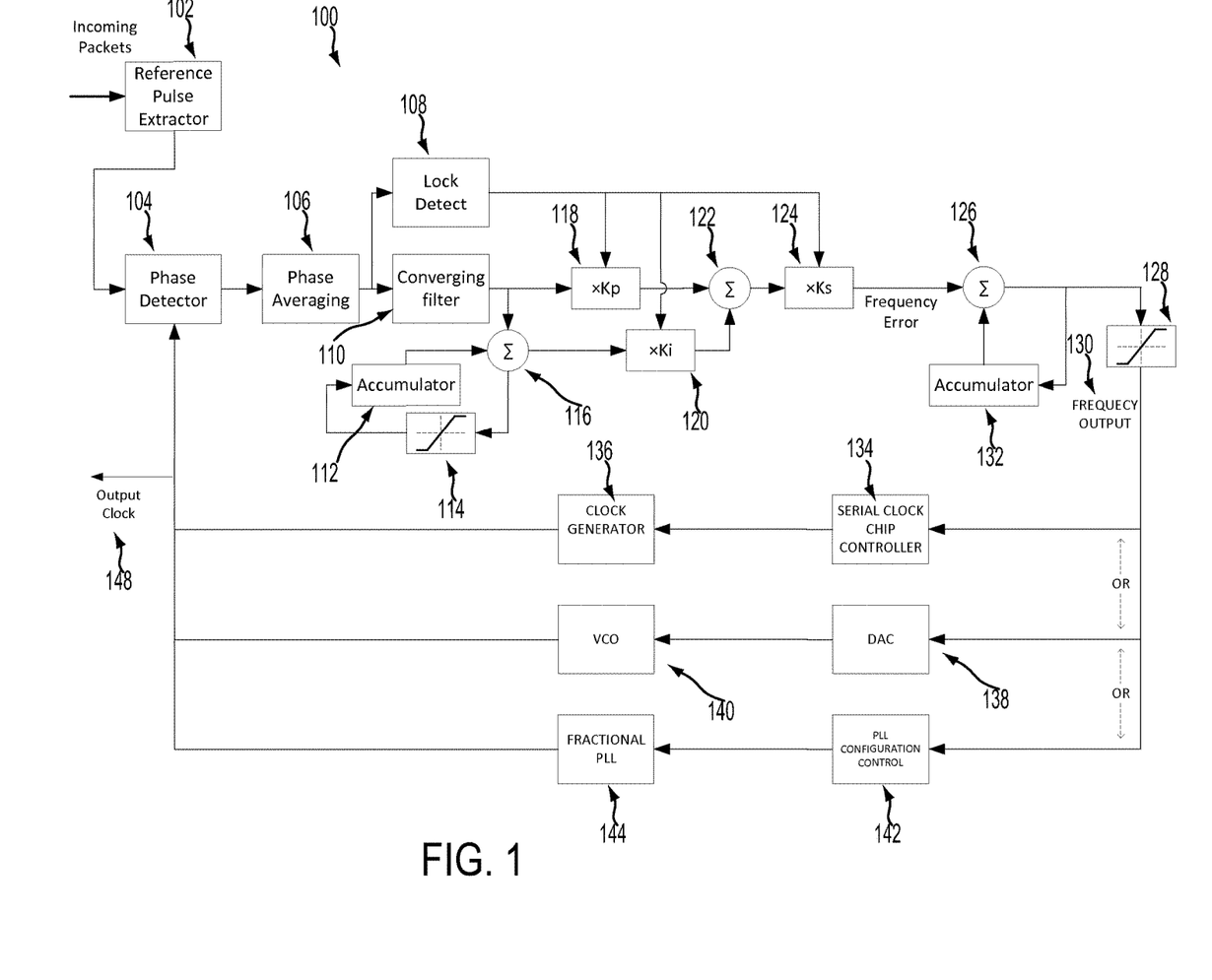
FIG. 1 is a block diagram of a clock controller, according to embodiments discussed herein.

FIG. 1 is a block diagram of a clock controller assembly 100 for clock recovery. Incoming packets are input to reference pulse extractor 102. The reference pulse extractor 102 scans the packets for a regularly occurring marker such as end-of-frame and generates a reference pulse which it sends to phase detector 104. The phase detector measures a phase error between the reference signal, and a counter that is clocked by the output clock 148. It then sends the phase error to a phase averaging unit 106. The output from the phase averaging unit 106 is sent to a lock detect unit 108 and in parallel to a converging filter 110. The lock detect unit 108 determines which of several pre-programmed coefficients to load into ×Kp multiplier 118, ×Ki multiplier 120 and also to ×Ks multiplier 124. The converging filter 110 detects the trend of input phase error values and only forwards the new average phase error into the loop filter (118-124) if the phase error magnitude is increasing. When allowed by the converging filter 110, the average phase error is sent to first adder 116 and also to ×Kp multiplier 118. First adder 116 adds the new average phase error to an accumulation of all previous phase errors to approximate the mathematical integral of phase error, which it provides to ×Ki multiplier 120. First adder 116 also sends its integral approximation to an overflow filter 114 which limits the integral to within certain bounds, and stores the limited integral into first accumulator 112. First accumulator 112 holds the integral value for the next update cycle when it will provide the second input for first adder 116.

Both ×Kp multiplier 118 and ×Ki multiplier 120 scale their respective inputs by the coefficient selected by the lock detect unit 108, and then provide input to second adder 122. Second adder 122 then sends the sum to ×Ks multiplier 124, which also scales its input by the coefficient selected by lock detect unit 108. The scaled output of ×Ks multiplier 124 is the estimated Frequency Error, which is added to an accumulation of all previous Frequency Errors by third adder 126. The output from third adder 126 is also stored in second accumulator 132 for use in the next update cycle. Third adder 126 provides input to second overflow filter 128 which limits the digital frequency output 130 to be within a programmed minimum and maximum value.

FIG. 1 depicts several embodiments of clock generation. In a first embodiment, frequency output 130 provides input to serial clock chip controller 134. Serial clock chip controller 134 provides input to clock generator 136, which generates the output clock 148 and provides input to phase detector 104 to close the control loop. In a second embodiment, frequency output 130 provides input to digital to analog converter (DAC) 138. DAC 138 provides input to Voltage Controlled Oscillator (VCO) 140. The output from VCO 140 is the output clock 148 which is also provided as input to phase detector 104 to close the control loop. A third embodiment provides frequency output 130 to phase locked loop (PLL) reconfiguration control unit 142. The PLL configuration control unit updates the parameters of fractional PLL 144. The output from fractional PLL 144 is the output clock 148 which is also provided to phase detector 104 to close the control loop.

FIG. 1 depicts one embodiment of an apparatus for clock recovery. The reference pulse extractor 102 looks for a particular packet in the data stream. If the particular packet is missing, then the apparatus estimates its presence. This estimation generates a "ghost" packet where the missing packet would have been. The "ghost" estimation can be used in place of a real extracted pulse by the phase detector 104. The large number of samples accumulated in the phase averaging block 106 can smooth out the uncertainty introduced by the missing packet and its "ghost".

In operation, incoming packets are sent to reference pulse extractor 102, where a pulse that is the raw clock reference is extracted. The reference pulse extractor sends the clock pulse to the phase detector 104. In the phase detector 104 the clock pulse is phase measured against the reference clock. The phase difference is then sent to the phase averaging unit 106. The phase averaging unit 106 accumulates and averages the clock detector phase differences for a given number of clock pulses. The output of phase averaging unit 106 is sent to both lock detect unit 108 and converging filter 110.

Lock detect unit 108 serves as the circuit controller that selects block size for the phase averaging unit 106, and also coefficients for ×Kp multiplier 118, ×Ki multiplier 120, and ×Ks multiplier 124. The lock detect unit 108 also detects when the generated clock and reference signal are synchronized. In this situation, lock detect unit 108 indicates the reference signal is locked to the generated clock.

The converging filter 110 may be turned off, thus passing on the average phase to the loop filter (proportional and integral portions of the circuit). When the converging filter 110 is on, the average phase error is compared against the recent maximum phase error. If the new average phase error is greater in magnitude than the recent maximum phase error, then the recent maximum phase error is updated to the value of the new average phase error, and the downstream loop filter is allowed to process the new average phase error. If the new average phase error is zero, or of opposite sign to the recent maximum phase error, then a zero-crossing is detected, and the recent maximum phase error is updated to the value of the new average phase error regardless of the magnitude comparison. Whenever the sign is the same, and the magnitude of the new phase error is less than the recent maximum phase error a converging trend is detected, and the loop filter is held in its previous state. In other words, updates that are already converging are filtered out and not acted upon. The output phase value from converging filter 110 is sent to the proportional unit ×Kp 118, and the converging filter 110 output is multiplied by the ×Kp 118 coefficient. This product is then sent to second adder 122.

The output phase value from converging filter 110 is sent to the integral circuit, which consists of accumulator 112, filter 114, and first adder 116. The output from first adder 116 of the integral circuit is sent to integral constant multiplier ×Ki 120. The output from integral constant multiplier ×Ki 120 is sent to second adder 122. The resulting summed output from second adder 122 is then sent to constant multiplier ×Ks 124. The resulting output from constant multiplier ×Ks 124 is the frequency error which is sent to third adder 126 where it is added to the sum of all previous frequency error values to create the loop filter output. The loop filter output is stored in second accumulator 132 to be stored for the next update cycle. The loop filter output is also sent to limiting filter 128 which constrains the output to be within a programmable minimum and maximum value. The resulting frequency output value is then sent to a serial clock chip controller 134, or may be sent to a digital to analog converter 138, or may also be sent to phase locked loop configuration controller 142.

The serial clock chip controller 134 generates a series of "speed up" and "slow down" commands which are then sent to clock generator 136, which generates the output clock of the circuit. The output clock of the circuit is then input to phase detector 104 to close the control loop.

In an alternate embodiment the output from the limiting filter 128 may be sent to a digital to analog converter (DAC) 138. The analog output of the DAC 138 is sent to Voltage Controlled Oscillator (VCO) 140, where it is used to control the VCO 140. The output of the VCO 140 is the output clock of the circuit, which is input to phase detector 104 to close the control loop.

In a further alternate embodiment the output from the limiting filter 128 may be sent to phase locked loop (PLL) configuration controller 142. The PLL configuration controller 142 generates commands which are sent to the fractional PLL unit 144, where they are used to determine the fractional PLL used to generate the reference clock of the circuit. The output of fractional PLL 144 is the output clock which is also input to the phase detector 104 to close the control loop.

Figure 2:
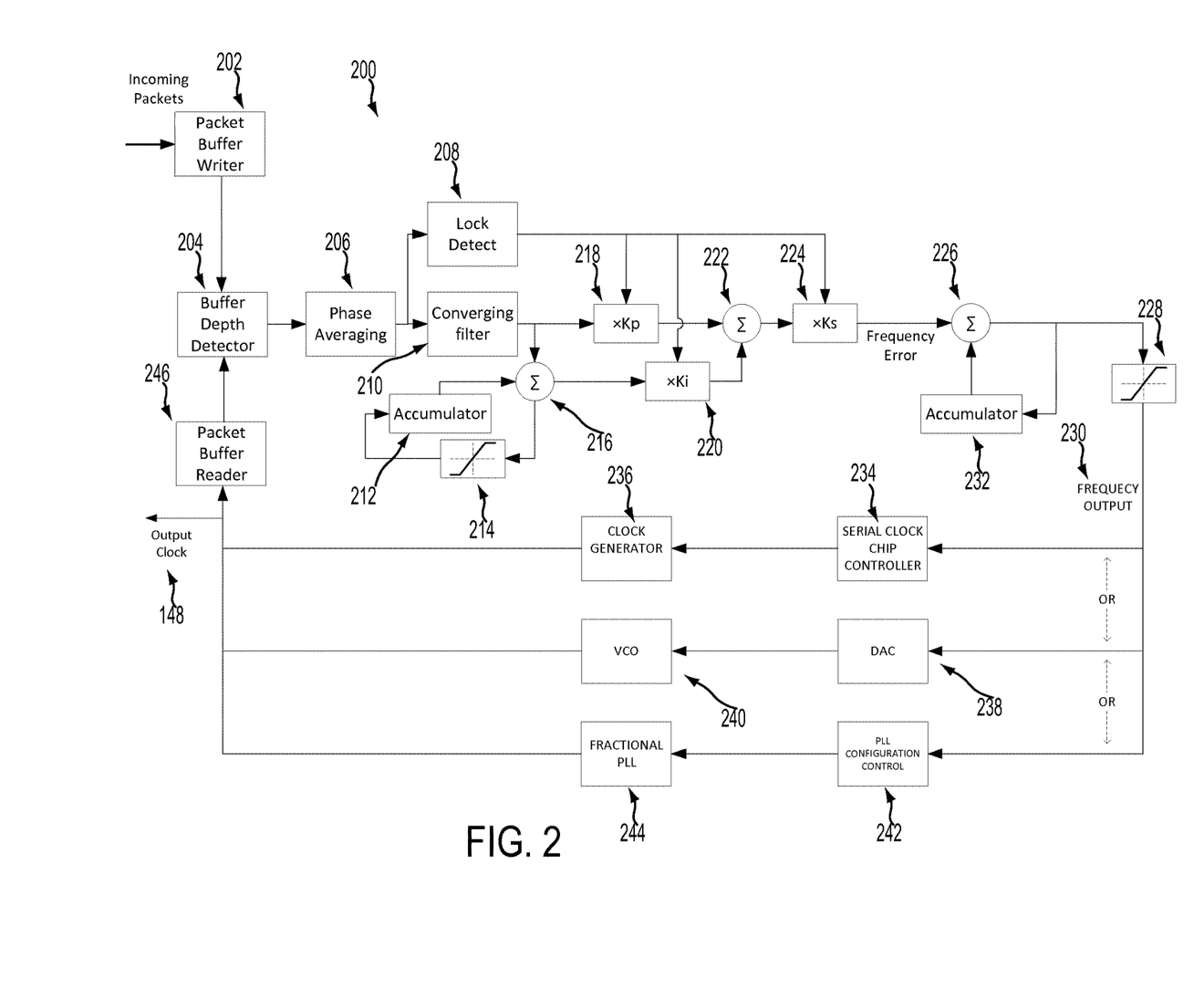
FIG. 2 is a block diagram of a further embodiment of a clock controller, according to embodiments discussed herein.

FIG. 2 is a block diagram of a further embodiment of a clock controller assembly 200 for clock recovery. Incoming packets are input to packet buffer writer 202 at the native internet packet rate. The packet writer buffer 202 writes the incoming packets to a buffer, and the packet buffer writer 202 sends a write pointer to buffer depth detector 204. The buffer depth detector 204 compares the write pointer to a read pointer from packet buffer reader 246 to calculate the number of packets in the buffer. The output of buffer depth detector 204 is sent to a phase averaging unit 206. The output from the phase averaging unit 206 is sent to a lock detect unit 208 and in parallel to a converging filter 210. The lock detect unit 208 forwards lock information to ×Kp multiplier 218, ×Ki multiplier 220 and also to ×Ks multiplier 224. The output from converging filter 210 is sent to first adder 216 and also to ×Kp multiplier 218. First adder 216 provides output to ×Ki filter 220. First adder 216 also receives input from first accumulator 212. First accumulator 212 also receives input from first overflow filter 214. First overflow filter 214 also receives input from first adder 216.

Both ×Kp multiplier 218 and ×Ki multiplier 220 provide input to second adder 222. Second adder 222 then provides input to ×Ks multiplier 224, which also received input from lock detect unit 208. ×Ks multiplier 224 output is the frequency error, which is input to third adder 226 which also receives frequency error input from second accumulator 232. The output from third adder 226 is provided to second accumulator 232 and is also input to limiting filter 228 which constrains the frequency output 230 to be between a minimum and maximum value.

Limiting filter 228 can provide input to serial clock chip controller 234. Serial clock chip controller 234 provides input to clock generator 236, which generates the output clock 248 which in turn provides input to packet buffer reader 238. Limiting filter 228 can also provide input to digital to analog converter (DAC) 240. DAC 240 provides input to Voltage Controlled Oscillator (VCO) 242. The output from VCO 242 generates the output clock 248 which is also provided as input to packet buffer reader 238. A third possible connection from limiting filter 228 is provided to phase locked loop (PLL) configuration control unit 244. The PLL configuration control unit provides input to fractional PLL 246. The output form fractional PLL 246 is also provided to packet buffer reader 238. Packet buffer reader 238 provides input to buffer depth detector 204.

In operation, incoming packets are written by packet buffer writer 202 into a buffer, and a pointer to that packet in the buffer is sent to the buffer depth detector 204. In the buffer depth detector 204 the write pointer is compared to a read pointer to determine the buffer depth, and that is compared to an ideal buffer depth to generate a buffer depth error. The buffer depth error is then sent to the phase averaging unit 206. The phase averaging unit 206 accumulates and averages the buffer depth errors for a given number of data points. The output of phase averaging unit 206 is sent to both lock detect unit 208 and converging filter 210.

Lock detect unit 208 serves as the circuit controller that selects constants for the phase averaging unit 206, and also coefficients for Kp multiplier 218, Ki multiplier 220, and Ks multiplier 224. In addition, the lock detect circuit 208 may turn off the converging filter 210. The lock detect unit 208 also detects when the generated clock is synchronized. In this situation, lock detect unit 208 indicates the reference clock is locked to the packet arrival rate.

The converging filter 210 may be turned off, thus passing on the average phase to the loop filter (proportional and integral portions of the circuit). When the converging filter 210 is on, the average phase error is compared against the recent maximum phase error. If the new average phase error is greater in magnitude than the recent maximum phase error, then the recent maximum phase error is updated to the value of the new average phase error, and the downstream loop filter is allowed to process the new average phase error. If the new average phase error is zero, or of opposite sign to the recent maximum phase error, then a zero-crossing is detected, and the recent maximum phase error is updated to the value of the new average phase error regardless of the magnitude comparison. Whenever the sign is the same, and the magnitude of the new phase error is less than the recent maximum phase error a converging trend is detected, and the loop filter is held in its previous state. In other words, updates that are already converging are filtered out and not acted upon. The output phase value from converging filter 210 is sent to the proportional unit ×Kp 218, and the converging filter 210 output is multiplied by the ×Kp 218 coefficient. This product is then sent to second adder 222.

The output phase value from converging filter 210 is sent to the integral circuit, which consists of accumulator 212, filter 214, and first adder 216. The output from first adder 216 of the integral circuit is sent to integral constant multiplier ×Ki 220. The output from integral constant multiplier ×Ki 220 is sent to second adder 222. The resulting summed output from second adder 222 is then sent to constant multiplier ×Ks 224. The resulting output from constant multiplier ×Ks 224 is the frequency error which is sent to third adder 226 where it is added to the sum of all previous frequency error values to create the loop filter output. The loop filter output is stored in second accumulator 232 to be stored for the next update cycle. The loop filter output is also sent to limiting filter 228 which constrains the output to be within a programmable minimum and maximum value. The resulting frequency output value is then sent to a serial clock chip controller 234, or may be sent to a digital to analog converter 238, or may also be sent to phase locked loop configuration controller 242.

The serial clock chip controller 234 generates a series of "speed up" and "slow down" commands which are then sent to clock generator 236, which generates the output clock of the circuit. The output clock of the circuit is then input to phase detector 104 to close the control loop.

In an alternate embodiment the output from the limiting filter 228 may be sent to a digital to analog converter (DAC) 240. The analog output of the DAC 240 is sent to Voltage Controlled Oscillator (VCO) 242, where it is used to control the VCO 242. The output of the VCO 242 is the output clock 248 of the circuit, which is input to packet buffer reader 238.

In a further alternate embodiment the output from the limiting filter 228 may be sent to phase locked loop (PLL) configuration controller 244. The PLL configuration controller 244 output is sent to the fractional PLL unit 246, where it is used to determine the fractional PLL used to generate the output clock 248 of the circuit. The output of fractional PLL 246 is input to the packet buffer reader 238.

Figure 3:
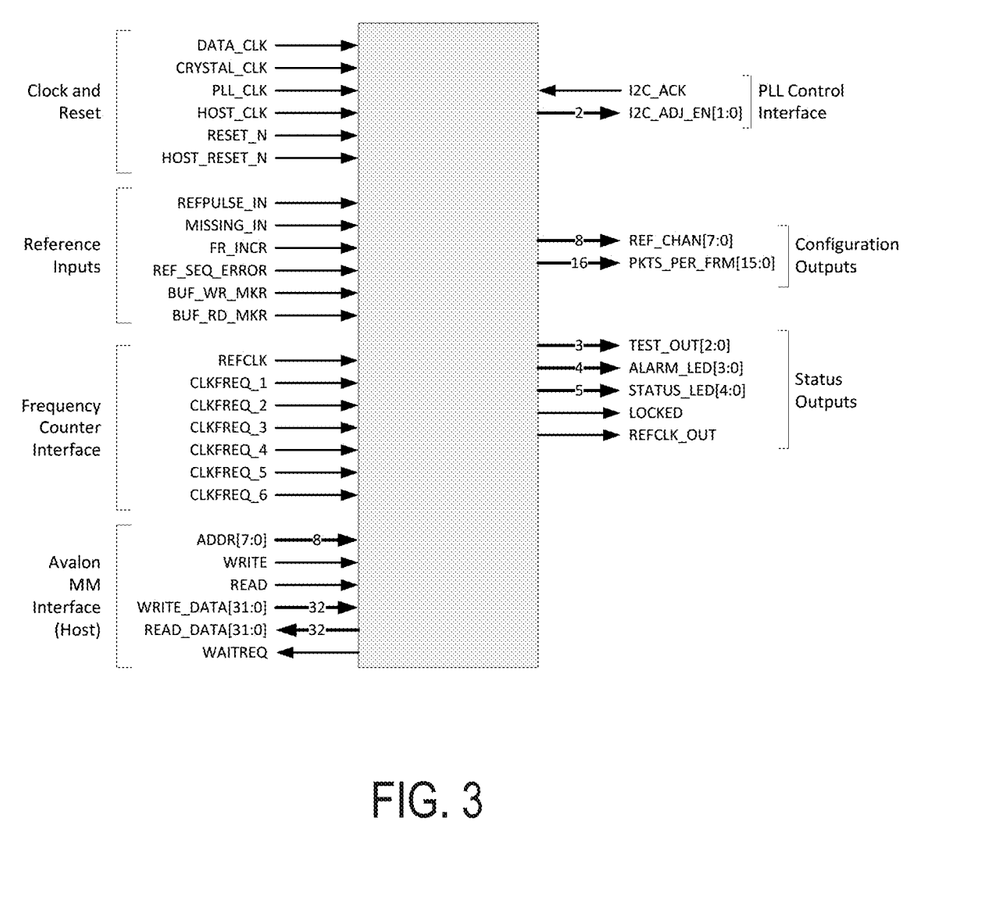
FIG. 3 is a pin-out diagram of an apparatus for clock recovery, according to embodiments discussed herein.

FIG. 3 illustrates an example of pin assignments of the clock recovery apparatus and delineates the clock and reset pins, reference inputs, frequency counter interface, and host interface.

Figure 4A:
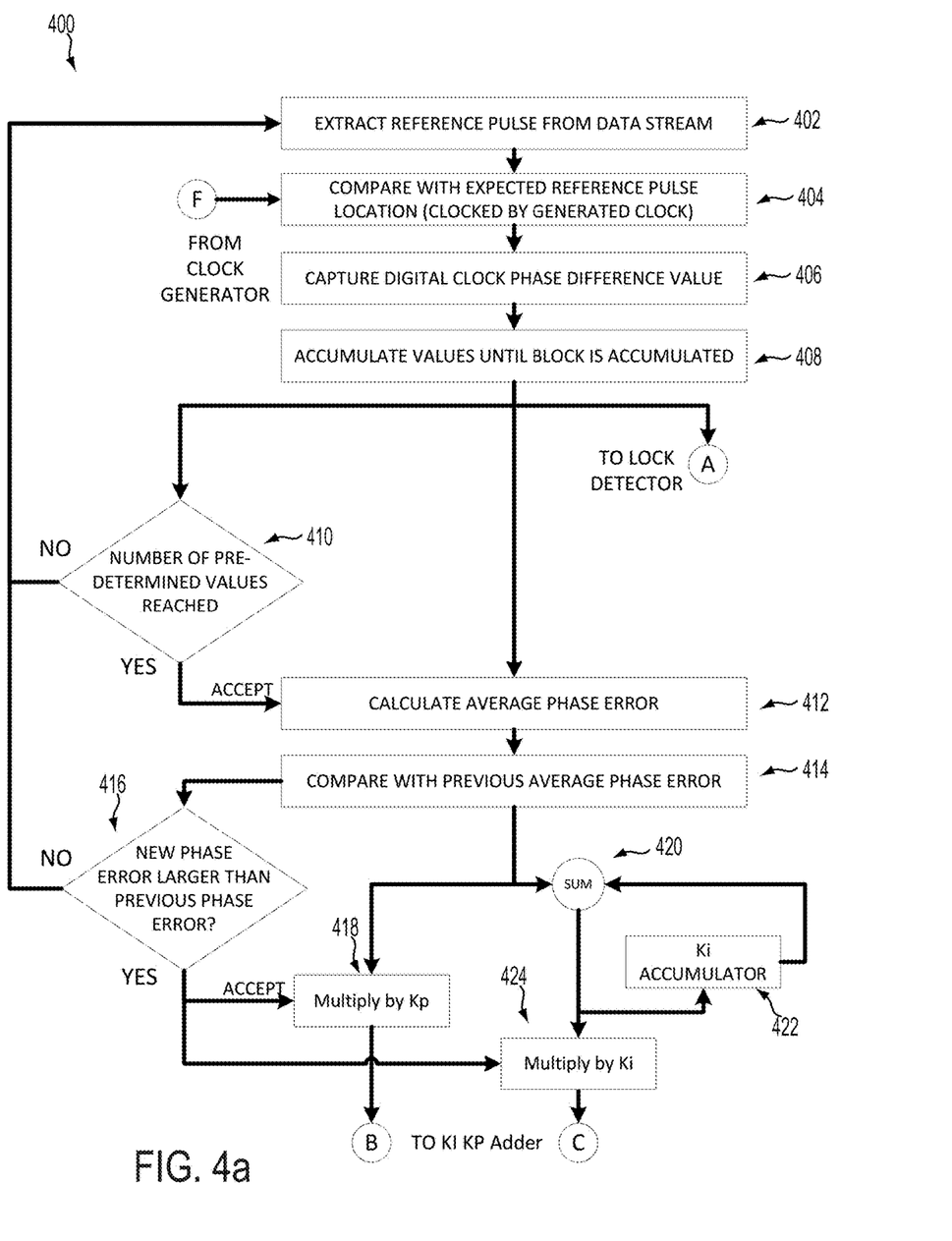
FIGS. 4A, 4B, and 4C comprise a flowchart of a method of clock recovery, according to embodiments discussed herein.
Figure 4B:
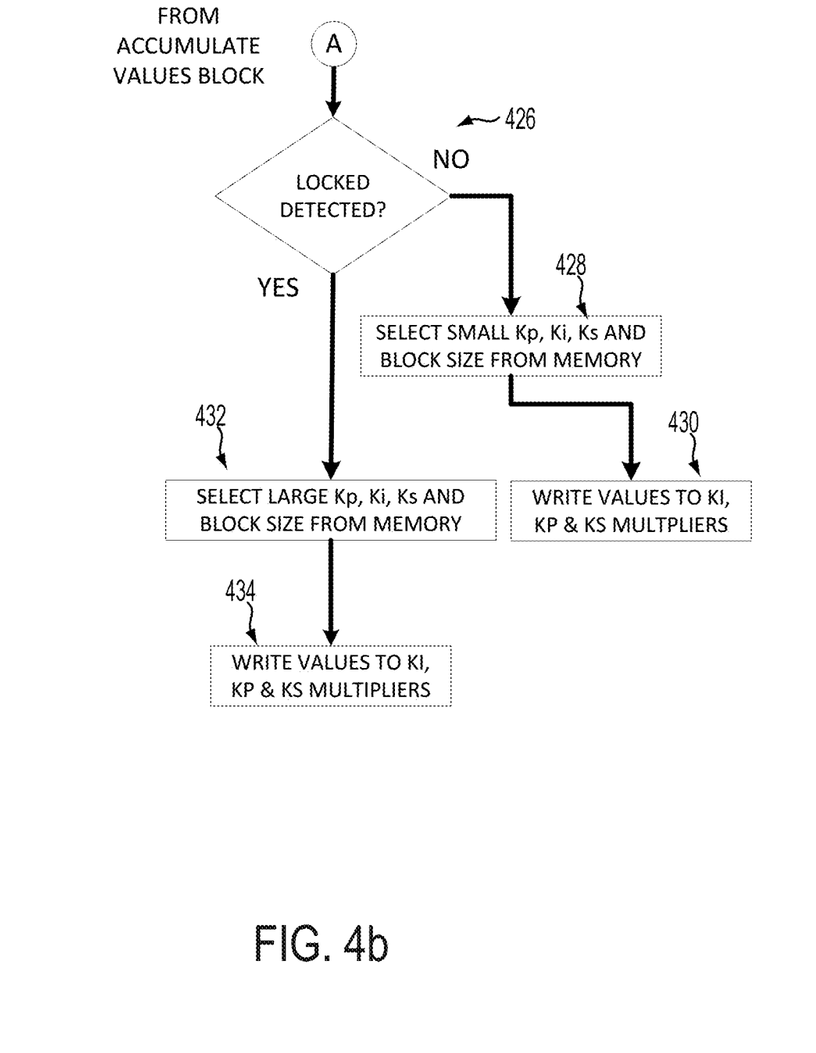
Figure 4C:
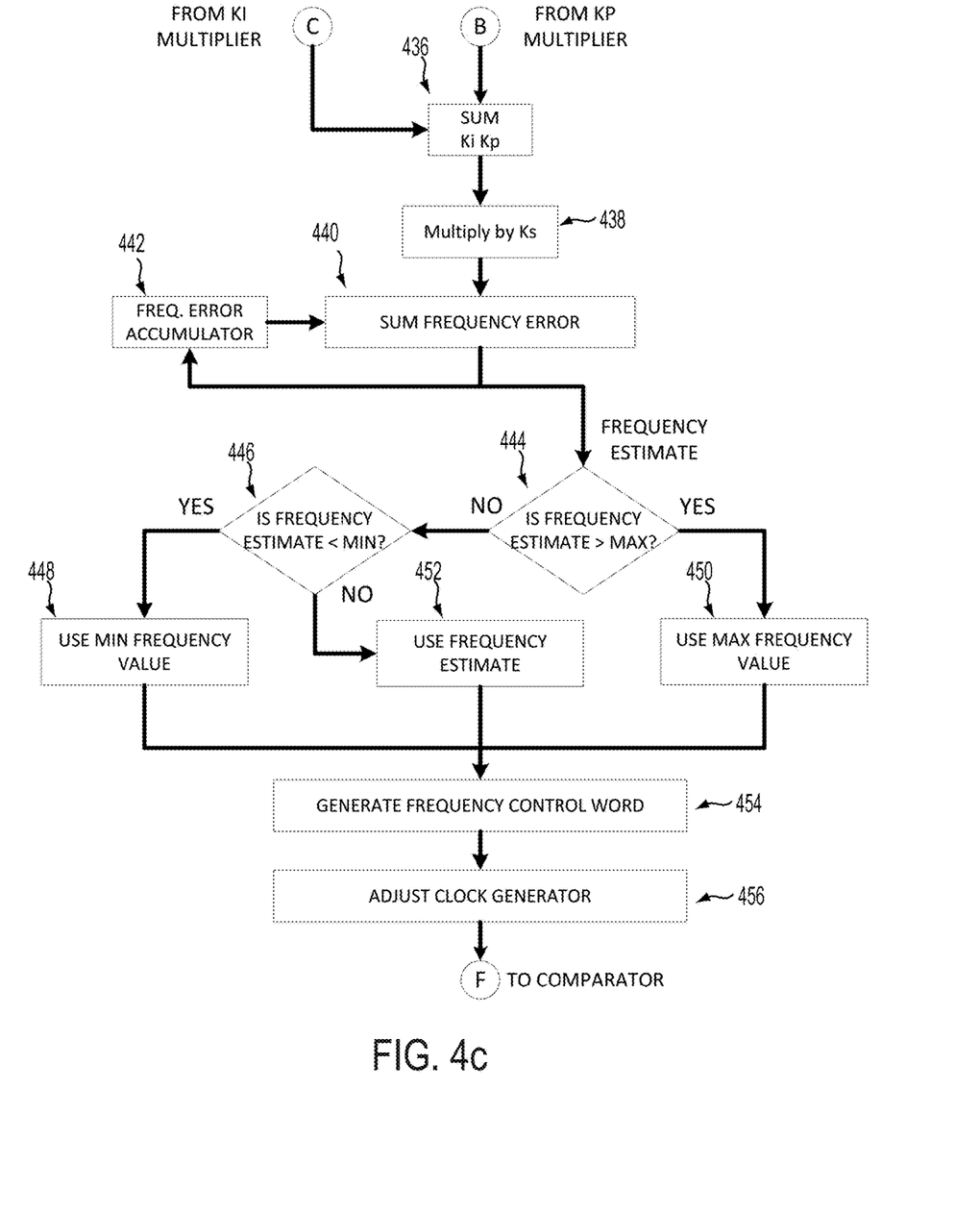

FIG. 4 is a flow diagram of a method of clock recovery, according to embodiments described above. The method 400, begins when the reference pulse is extracted from the data stream in step 402. The extracted reference pulse is then compared with the expected reference pulse location, as clocked by the generated output clock (F), in step 404. The digital phase difference clock value is then captured in step 406. These values are accumulated in step 408 until a complete block is accumulated.

The values from the accumulated block of step 408 are sent to a determination step 410 where it is determined if a predetermined number of values within the block has been reached. In addition, the values from the accumulated block of step 408 are sent to continuation step A. Also, the values from accumulated block of step 408 are sent to the step 412, where the average of the accumulated block of phase errors is calculated. The value from step 412 is sent to step 414 where it is compared with a previously captured phase error value. If the new value is smaller than the previously captured value, and its sign is the same, the method begins again with step 402. Otherwise the new value is captured in step 414 for future iterations, and step 418 and step 424 are allowed to update.

If in step 410 the number of predetermined values has not been reached, then the process returns to step 402, and a reference pulse is again extracted. If the number of predetermined values has been reached, then the value from step 412 is multiplied by Kp coefficient in step 418 (if allowed by step 416), and is sent to adder 420 to be added to the sum of all previous Phase error values stored in Ki accumulator in step 422. The output of step 420 approximates the integral of phase error, and is multiplied by the Ki coefficient in step 424 if allowed by step 416.

The Ki accumulator 422 provides input in step 420 an adder, where the average phase error from step 412 is summed together with the Ki accumulator value. The Ki term adder output is also sent to the Ki multiplier 424 and multiplied by the Ki coefficient. The adder of step 420 may output results to the Ki multiplier and to the Ki accumulator 422 for storage. A different process occurs with the Kp multiplier in step 418, where the average phase error of step 412 is input to the KP multiplier in step 418 by the Kp coefficient. Both the output of steps 418 and 424 are input to the Ki,Kp adder which provides input to continuation steps C and B.

The accumulate block values from 408, are input to a lock detector in step 426. If lock is detected "YES" branch in step 426, the process proceeds to step 432, where a large block size for phase averaging unit and larger coefficients Kp, Ki, and Ks are selected from memory. If lock is not detected "NO" branch in step 426, then the small size block is selected for phase averaging unit and smaller coefficients Kp, Ki, and Ks in step 428. If the small size block is selected in step 428, then the selected values are written to the Ki, Kp, and Ks multipliers in step 430. If the large block is selected in step 432, those values are written to the Ki, Kp, and Ks multipliers in step 434.

The adder receives input in step 436. This adder may receive input from the Ki multiplier continuation step C and from the Kp multiplier continuation step B. The output from step 436 Ki Kp second adder is sent to step 438 where it is multiplied by the Ks coefficient to scale the output to the correct range. Step 440 adds the output from step 438 to the value from the frequency error accumulator of step 442 to generate the frequency estimate. The frequency estimate is stored in step 442 for future iterations, and is passed to the output limiter of steps 444 to 452. Step 444 compares the frequency estimate to a programmed maximum output. If the frequency estimate exceeds the maximum value, (YES branch), then step 450 replaces the frequency estimate with the programmed maximum for processing in step 454. If the frequency estimate does not exceed the maximum value in step 444 (the NO branch), it is compared against a programmed minimum value in step 446. If the frequency estimate is less than the programmed minimum value (YES branch), the frequency estimate is replaced with the programmed minimum for processing in step 454. If the frequency estimate is within the bounds of the programmed maximum and minimum values, then it is used directly in step 454 (shown in No branch and step 452). The output from steps 444-452 is sent to step 454, where the control protocol of the particular generator implementation is generated. Depending on the clock generator of step 454, the control word could be a series of "up/down" commands sent over a serial interface, a digital value representing a VCO analog control voltage, a fractional parameter, or a reference clock period, among other possible options. Whatever form it takes for the particular embodiment the control word from step 454 is sent to the clock generator in step 456 to adjust the clock generator output. The clock generator output from step 456 is sent to step 404 to clock the comparison of the extracted reference pulse from the data stream 402 with the expected reference pulse location in step 404.

Figure 5:
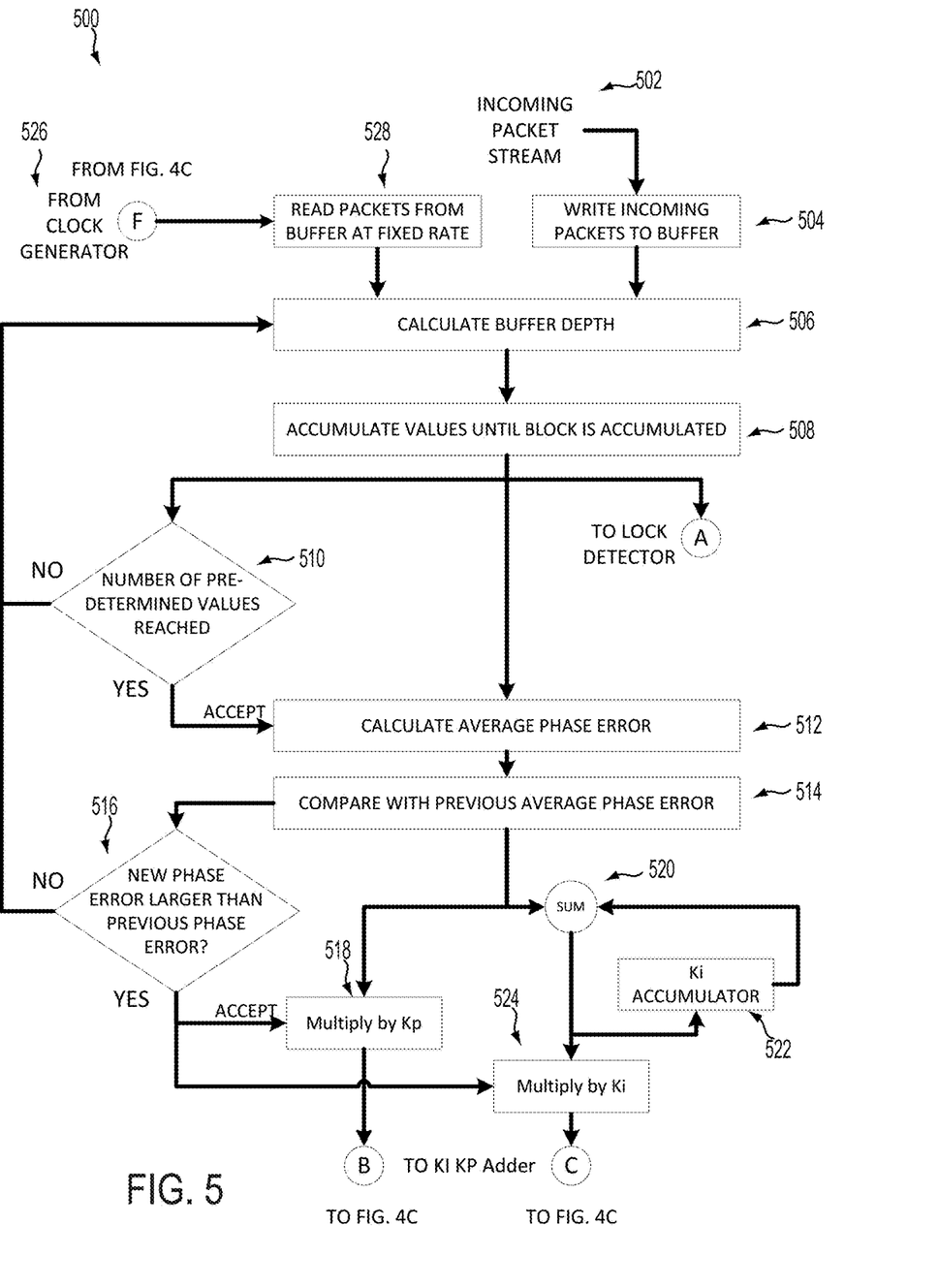
FIG. 5 comprises a flowchart of a further method of clock recovery according to embodiments discussed herein.

FIG. 5 is a flow diagram of a further embodiment of a method for clock recovery. The method 500, begins when the incoming packet steam is extracted from the data stream in step 502 and written into a buffer. The incoming packet stream is then extracted from the buffer at a fixed rate in step 528, as clocked by the generated output clock (F), in step 504. Data from both steps 502 and 528 is sent to step 506 to calculate the buffer depth. These values are accumulated in step 508 until a complete block is accumulated.

The values from the accumulated block of step 508 are used in step 510. where it is determined if a predetermined number of values within the block has been reached. In addition, the values from the accumulated block of step 508 are sent to continuation step A. The values from accumulated block of step 508 are also sent to the step 512, where the average of the accumulated block of phase errors is calculated. The value from step 512 is sent to step 514 where it is compared with a previously captured phase error value. If the new value is smaller than the previously captured value, and its sign is the same, the method begins again returns step 502. Otherwise, the new value is captured in step 514 for future iterations, and step 518 and step 524 are allowed to update.

The Ki accumulator in step 522 provides input to step 520 an adder, where the average phase error from step 512 is summed together with the Ki accumulator value. The Ki term adder output is also sent to the Ki multiplier 524 and multiplied by the Ki coefficient. The adder of step 520 may output results to the Ki multiplier and to the Ki accumulator 522 for storage. A different process occurs with the Kp multiplier in step 518, where the average phase error of step 512 is input to the KP multiplier in step 518 by the Kp coefficient. Both the output of steps 518 and 524 are input to the Ki,Kp adder which provides input to continuation steps C and B.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers.

Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of clock recovery, comprising:
extracting a reference pulse from an incoming data stream without a reference clock;
comparing the extracted reference pulse with a generated clock signal;
detecting a phase difference of the extracted reference pulse in relation to the generated clock signal;
accumulating a phase difference of the extracted reference pulse with respect to the generated clock signal over a predetermined number of samples until a number of phase differences is reached;
determining if the magnitude of the accumulated phase difference is increasing or decreasing, or if the sign of the accumulated phase difference has changed;
computing a frequency error from the accumulated phase difference, wherein if the phase difference magnitude is increasing, or if the sign has changed, inversely adjusting the frequency error;
comparing the frequency error with an upper limit and a lower limit;
determining if the frequency error is trending to exceed a bounds defined by the upper and lower limit
adjusting a generated clock output frequency using the frequency error to produce a new clock frequency; and
using the new clock frequency as the generated clock signal to produce a clock-synchronized signal.

2. The method of claim 1, further comprising:
modifying and summing the frequency error to integrate the frequency error;
selecting an adaptive constant based on a current lock status; and
applying the adaptive constant to form a scaled integral error.

3. The method of claim 2, further comprising:
determining a second adaptive constant based on a current lock status; and
applying the second adaptive constant to form a scaled linear error signal.

4. The method of claim 1, wherein, if the frequency error is trending to exceed the upper or lower limits, then replacing a third composite error by the upper or lower limit value that would otherwise be exceeded.

5. The method of claim 4, wherein a generated clock frequency is adjusted based on a frequency control word and the frequency error.

6. An apparatus for clock recovery, comprising:
a reference pulse extractor in communication with a phase detector;
a phase detector configured to detect a phase difference of an extracted reference pulse in relation to a generated clock signal;
a phase averaging unit in communication with a clock generator and a controller;
a lock detector in communication with the phase averaging unit and a loop filter;
a first adder configured for scaling content Kp and an averaged phase error and scaling content Ki and an accumulated phase error; and
a second adder configured to accumulate a product of the first adder and scalar content Ks;
at least one bypass filter; and
at least one accumulator configured to convert a frequency error signal to a frequency control word.

7. The apparatus of claim 6, further comprising:
a first filter, wherein the first filter is a saturating loop filter or an integral loop filter; and
a second filter, wherein the second filter is a limiting filter.

8. The apparatus of claim 7, further comprising:
a first accumulator for accumulating a summed average input phase error for an integral control term; and
a second accumulator for accumulating an output frequency control word.

9. A non-transitory computer readable media including program instructions which when executed by a processor cause the processor to perform a method of comprising the steps of:
extracting a reference pulse from an incoming data stream without a reference clock;
comparing the extracted reference pulse with a generated clock signal;
detecting a phase of the extracted reference pulse in relation to the clock signal;
accumulating a phase difference of the extracted reference pulse with respect to the clock signal over a predetermined period of time until a predetermined number of phase differences is reached;
computing a frequency error from the accumulated phase difference;
modifying and summing the frequency error to integrate the frequency error;
selecting an adaptive constant based on a current lock status;
applying the adaptive constant to form a scaled linear error;
adjusting the generated clock output frequency using the scaled linear error to produce a new clock frequency; and
using the new clock frequency as the generated clock signal to produce a clock-synchronized signal.

10. The non-transitory computer readable media including the program instructions of claim 9, further comprising determining if the magnitude of the accumulated phase differences are increasing or decreasing and inversely adjusting frequency error if the phase differences are increasing, or if the sign of the phase differences has changed.

* * * * *